(12) United States Patent
Bonaccio et al.

(10) Patent No.: US 7,454,305 B2
(45) Date of Patent: Nov. 18, 2008

(54) METHOD AND APPARATUS FOR STORING CIRCUIT CALIBRATION INFORMATION

(75) Inventors: Anthony R. Bonaccio, Shelburne, VT (US); Allen P. Haar, State College, PA (US); Joseph A. Iadanza, Hinesburg, VT (US); Douglas W. Stout, Milton, VT (US); Ivan L. Wemple, Shelburne, VT (US)

(73) Assignee: International Business Machines Corporation, Armonk, NY (US)

( * ) Notice: Subject to any disclaimer, the term of this patent is extended or adjusted under 35 U.S.C. 154(b) by 392 days.

(21) Appl. No.: 11/164,040

(22) Filed: Nov. 8, 2005

(65) Prior Publication Data

US 2007/0115019 A1    May 24, 2007

(51) Int. Cl.
*G01R 31/00* (2006.01)
*G06F 19/00* (2006.01)

(52) U.S. Cl. .................. 702/117; 702/118; 702/119; 702/120; 702/121; 324/765

(58) Field of Classification Search .............. 702/57, 702/58, 95, 117–123; 324/765
See application file for complete search history.

(56) References Cited

U.S. PATENT DOCUMENTS

| | | | |
|---|---|---|---|
| 5,757,264 A | 5/1998 | Petit | |
| 5,798,947 A * | 8/1998 | Ye et al. | 702/95 |
| 5,838,076 A | 11/1998 | Zarrabian et al. | |
| 2002/0015328 A1* | 2/2002 | Dono et al. | 365/185.08 |
| 2007/0115019 A1* | 5/2007 | Bonaccio et al. | 324/765 |
| 2007/0290714 A1* | 12/2007 | Nguyen et al. | 326/30 |

* cited by examiner

*Primary Examiner*—Eliseo Ramos-Feliciano
*Assistant Examiner*—Phuong Huynh
(74) *Attorney, Agent, or Firm*—W. Riyon Harding; Dillon & Yudell LLP

(57) ABSTRACT

A method for altering circuit characteristics to make them independent of processing parameters of devices within an integrated circuit is disclosed. A process parameter is measured by a kerf or on-chip built-in test on a selective set of chip on a wafer, and the results are stored on a storage device within each respective chip. Then, for each of the remaining chips, a two-dimensional interpolation is performed to determine the process parameter value for the respective chip based on the measured value. The interpolated values are recorded along with the coordinates of the chip in an efuse control file. Such information is subsequently stored into an efuse module within the chip. On-chip digital control structures are used to adjust certain operational characteristics of a functional component within the chip based on the information stored in the efuse module.

12 Claims, 5 Drawing Sheets

METHOD AND APPARATUS FOR STORING CIRCUIT CALIBRATION INFORMATION

BACKGROUND OF THE INVENTION

1. Technical Field

The present invention relates to integrated circuits in general, and, in particular, to processing parameters within an integrated circuit. Still more particularly, the present invention relates to a method and apparatus for altering the electrical characteristics of circuits on a chip so that important circuit performance metrics are compensated for variations in processing parameters of devices within an integrated circuit.

2. Description of Related Art

Modern integrated circuit devices are typically mass-produced with a large number of critically-dimensioned features. In manufacturing, it is desirable to maintain the respective critical dimensions of each chip within a wafer constrained to certain respective values in order to ensure desired operating speeds and operational characteristics for the integrated circuits.

Each feature on each chip in a mass-produced wafer is the product of a succession of many process steps. Each process step is controlled by a combination of variable process parameters. Different combinations of variations in process parameter can occur on a random basis across the numerous process steps of a mass-production line on a chip-by-chip basis. Sometimes a specific combination of process parameters deviations is relatively innocuous but sometimes not, depending on which process parameters are deviated for a given chip and how their respective process steps interrelate to establish critical dimensions on that chip.

The present disclosure provides an improved method and apparatus for altering electrical characteristics of circuits so that they are independent of device parameter variations due to processing.

SUMMARY OF THE INVENTION

In accordance with a preferred embodiment of the present invention, a process parameter is measured by a kerf or on-chip built-in test on a selective set of chips on a wafer, and the results are stored on a storage device within each respective chip. Then, for each of the remaining chips, a two-dimensional interpolation is performed to determine the process parameter value for the respective chip based on the measured value. The interpolated values are recorded along with the coordinates of the chips in an efuse control file. Such information is subsequently stored into an efuse module within the chip. On-chip digital control structures are used to adjust certain operational characteristics of a functional component within the chip based on the information stored in the efuse module.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Due to process variations, some electrical parameters of circuits and/or chips on a wafer may require adjustments after fabrication. The present invention provides a method and apparatus for altering the electrical characteristics of circuits on a chip so that important circuit performance metrics are compensated for variations in processing parameters of devices on a wafer after fabrication. The present invention is illustrated by using resistance adjustment as an example. It is understood by those skilled in the art that the principles of the present invention are also applicable to other adjustable process parameters such as capacitance, threshold voltage, etc.

Conventionally, value adjustments of termination resistors have been performed by complex equipment having laser trimming capabilities. During testing, a laser trimmer is utilized to correct the value of a resistor in real-time. Basically, a resistance measurement is performed on each termination resistor, and the termination resistor is trimmed by a laser beam to correct the difference in resistance between the desired nominal value and the measured value. The trimming operation continues until the desired nominal resistance value is reached. Such technique for trimming termination resistors has been determined to be very accurate; however, it is also very time-consuming because a trimming operation may need to be repeated for each termination resistor. Laser trimming is also expensive because sophisticated laser equipment is required to be associated to a tester. Thus, "digitally adjustable" resistors are used in the mass production of low-cost chips.

Figure 1:
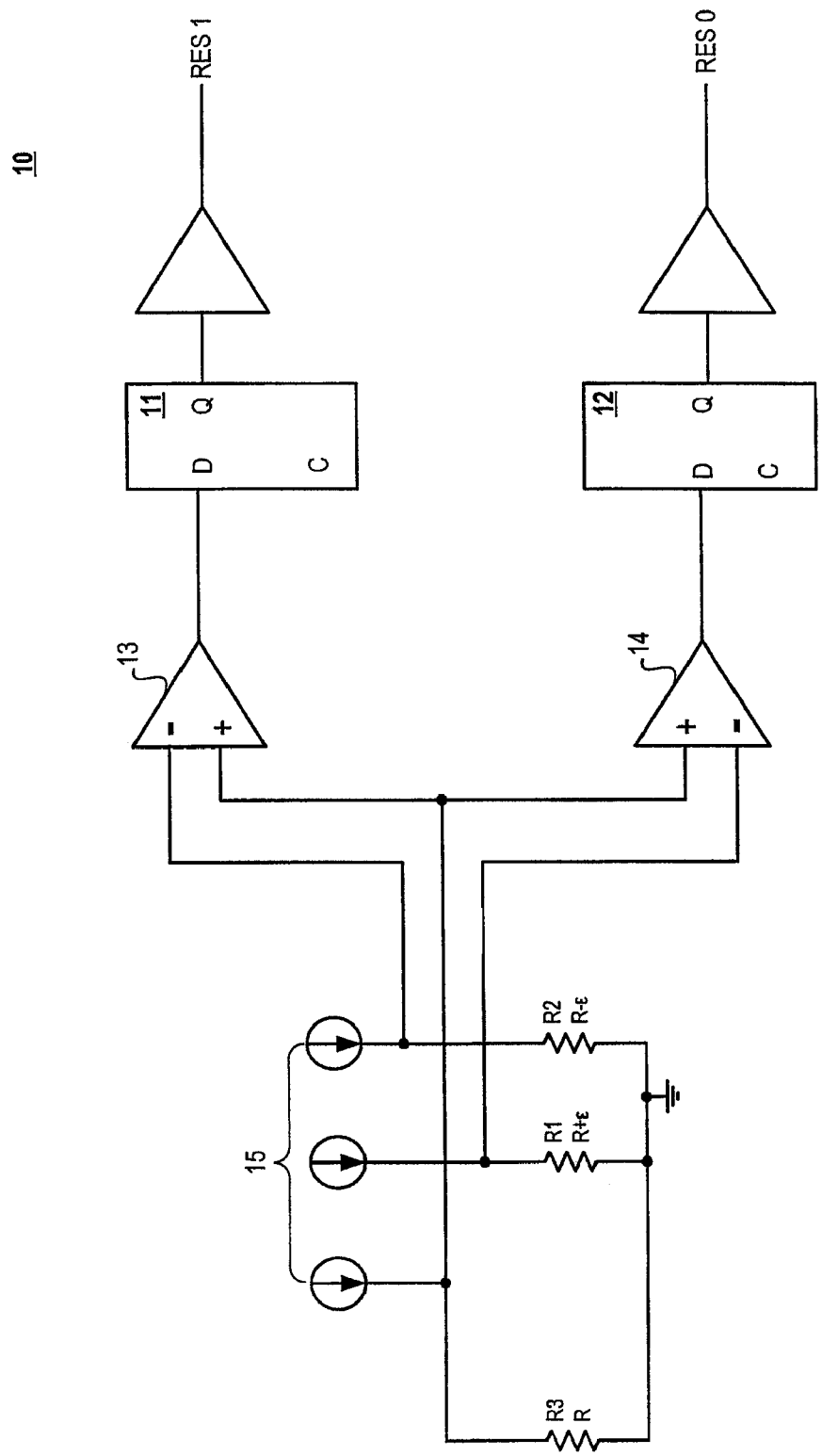
FIG. 1 is a block diagram of an apparatus for altering resistances of on-chip resistors, according to the prior art.

Referring now to the drawings and in particular to FIG. 1, there is illustrated a block diagram of an apparatus for altering resistances of on-chip resistors, according to the prior art. As shown, a resistance adjusting circuit 10 includes two latches 11-12, two comparators 13-14 and three current sources 15 for calibrating on-chip resistors R1-R2. During operation, current sources 15 force nearly identical currents through on-chip resistors R1-R2 and an off-chip precision resistor R3. On-chip resistors R1 and R2 are set to have nominal values bracketing the nominal value of R3 by some error bound $\in$. For example, R1 is set to R3+$\in$ and R2 is set to R3−$\in$. A judgment can be made as to the tolerance of other on-chip resistors by comparing the voltage drops across resistors R1-R3. For example, if R1 is set to R3+$\in$ and the voltage across R1 is measured to be lower than the voltage across R3, then it can be concluded that on-chip resistors that track R1 are generally lower than their nominal values by an amount greater than $\in$ and should be adjusted accordingly.

Figure 2:
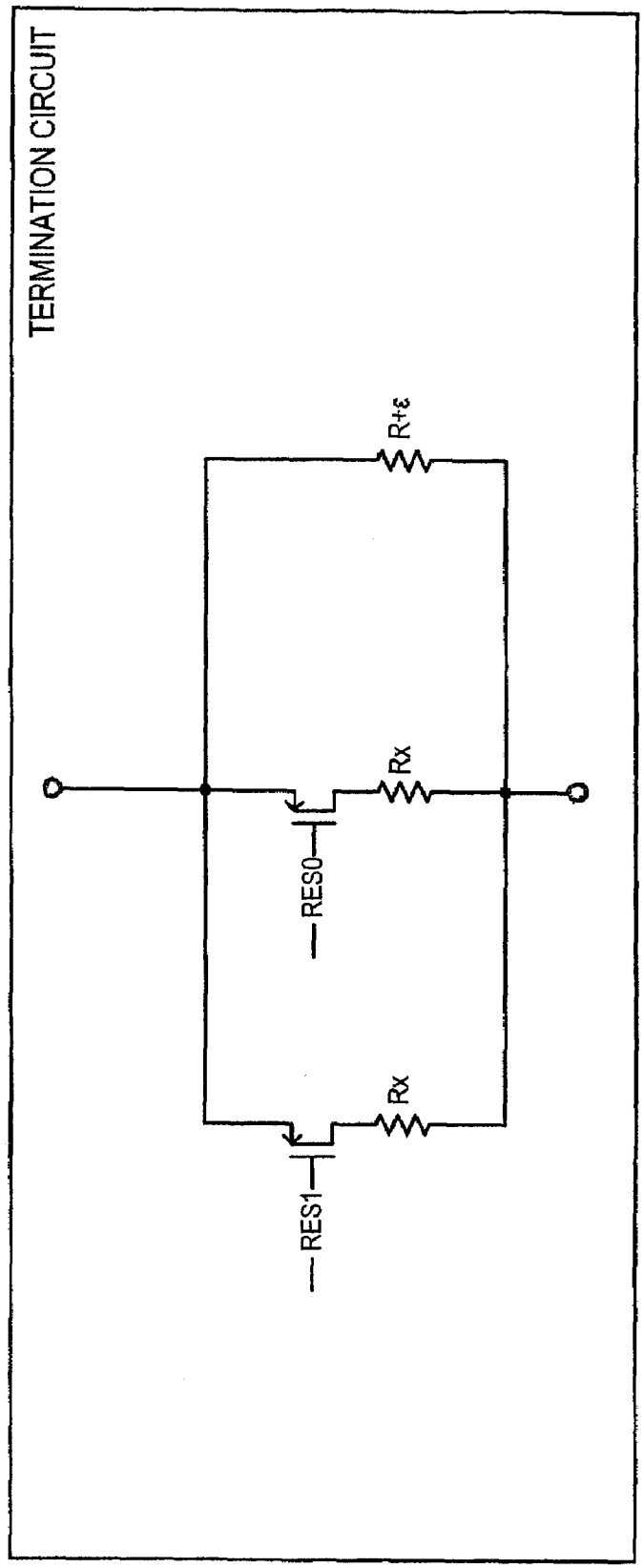
FIG. 2 is a block diagram of a termination circuit to be used in conjunction with the apparatus shown in FIG. 1.

The results of such judgment are expressed in digital values by the outputs of comparators 13-14. For example, a logical "0" from comparator 13 and a logical "0" from comparator 14 represent that the resistances of on-chip resistors R1-R2 are more than $\in$ greater than the nominal value of the resistance of off-chip resistor R3; a logical "1" from comparator 13 and a logical "0" from comparator 14 represent that the resistances of on-chip resistors R1-R2 are comparable to the resistance of off-chip resistor R3; etc. The digital values from comparators 13-14 are then stored in latches 11-12, and are subsequently utilized to adjust the resistances of on-chip resistors which track resistors R1-R2 by opening or closing various transistors within a termination circuit as shown in FIG. 2.

The problem with the above-mentioned resistor matching technique is that off-chip resistor R3 needs to be present at all times to maintain stable digital values in latches 11-12. Such requirement is inconvenient as well as is costly because each chip needs to reserve at least one pin to accommodate for an off-chip resistor.

In accordance with a preferred embodiment of the present invention, the digital values for performing resistance adjustments (from latches 11-12) are recorded in an efuse module during manufacturing. As such, the off-chip resistor can be eliminated in the final application and the pin intended for connecting to the off-chip resistor can be connected to ground.

Figure 3:
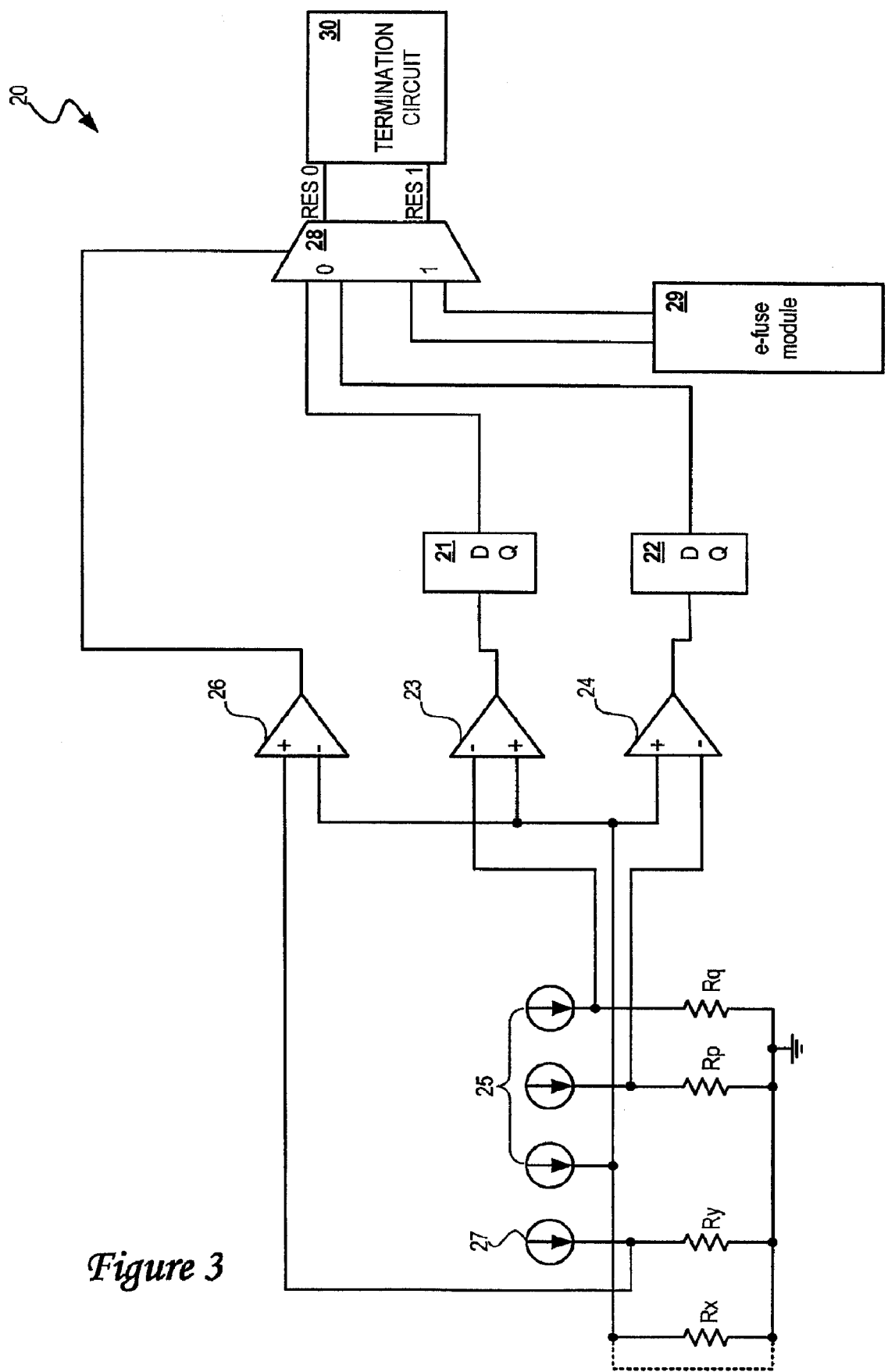
FIG. 3 is a block diagram of an apparatus for altering resistances of on-chip resistors, in accordance with a preferred embodiment of the present invention.

Referring now to FIG. 3, there is depicted a block diagram of an apparatus for altering resistances of resistors within an integrated circuit to match a predetermined value, in accordance with a preferred embodiment of the present invention. As shown, a resistance adjusting circuit 20 includes two latches 21-22, two comparators 23-24 and three current sources 25 coupled to on-chip resistors Rp-Rq. Resistance adjusting circuit 20 also includes a comparator 26, an auxiliary current source 27, a multiplexor 28 and an efuse module 29. Resistance adjusting circuit 20 is an open loop circuit (i.e., no feedback is involved). Multiplexor 28 selectively sends a pair of output signals from comparators 23-24 or a pair of output signals from efuse module 29 to a termination circuit 30 that is substantially similar to the termination circuit shown in FIG. 2. The select signal to multiplexor 28 is supplied by comparator 26 that compares the voltage differences between an off-chip precision resistor Rx and an on-chip resistor Ry. The value of on-chip resistor Ry does not need to be precise but needs to be able to differentiate between the presence of off-chip resistor Rx and a ground connection (because off-chip resistor Rx will eventually be removed). For the present embodiment, the value of on-chip resistor Ry is preferably half the value of off-chip resistor Rx.

During operation, current sources 25 force nearly identical currents through on-chip resistors Rp-Rq and off-chip resistor Rx, and a coarse judgment can be made as to the tolerance of on-chip resistors Rp-Rq by comparing the voltage drops across resistors Rp-Rq and Rx. The results of such coarse judgment are expressed in digital values by comparators 23-24. For example, logical "11" from comparators 23-24, respectively, represent that the resistances of on-chip resistors Rp-Rq are approximately an $\in$ lower than the resistance of off-chip resistor Rx; logical "00" from comparators 23-24, respectively, represent that the resistances of on-chip resistors Rp-Rq are approximately an $\in$ higher than the resistance of off-chip resistor Rx; and logical "10" from comparators 23-24, respectively, represent that the resistances of on-chip resistors Rp-Rq are within an $\in$ of the resistance of off-chip resistor Rx. The digital values from comparators 23-24 are then stored in latches 21-22, and are subsequently utilized to adjust the resistances of on-chip resistors which track resistors Rp-Rq by opening or closing corresponding transistors within termination circuit 30. The digital values from comparators 23-24 are also stored in efuse module 29. Preferably, efuse module 29 is implemented by an electrically programmable storage device such as an electrically programmable read-only memory.

Figure 4:
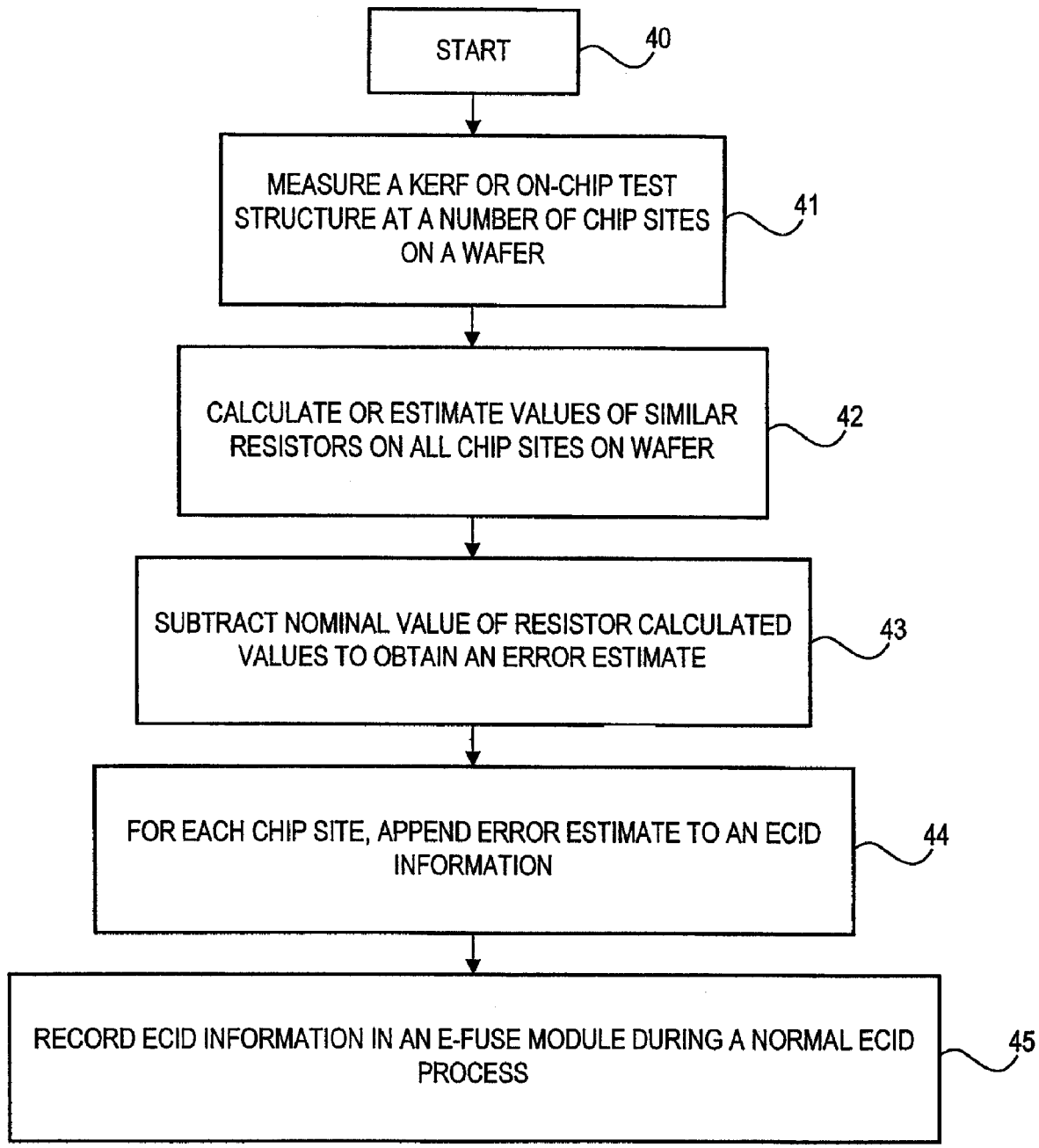
FIG. 4 is a high-level logic flow diagram of a method for recording a resistor tolerance value on a wafer, in accordance with a preferred embodiment of the present invention.

With reference now to FIG. 4, there is illustrated a high-level logic flow diagram of a method for recording a resistor tolerance (error) value on a wafer, in accordance with a preferred embodiment of the present invention. Starting in block 40, a kerf or on-chip test structure, such as the one described above for correcting the error in value of on-chip resistors to a digital code, is measured at a selective number of chip sites on a wafer, as shown in block 41. Kerf is defined to be the interstitial areas on an integrated circuit wafer separating chips that are to be removed by a saw. If all the chip sites on the wafer cannot be measured, then a two-dimensional interpolation process is utilized to calculate or estimate the values of the same parameter, such as resistances in the present example, on all of the remaining chip sites on the wafer, as depicted in block 42. The nominal parameter value is subtracted from calculated values to obtain an error estimate, as shown in block 43. For each chip site, the error estimate is appended to electronic chip identification (ECID) information or any other block of a non-volatile storage area of a chip, as depicted in block 44. The appended ECID information is subsequently recorded in an efuse module, such as efuse module 29 in FIG. 3, during a normal ECID process, as shown in block 45.

Information about the resistors can then be read from the efuse module, and appropriate actions can subsequently be taken to adjust the values of on-chip resistors accordingly.

A broadcast module on an integrated circuit chip is expected to read multiple parameters from an efuse or other similar type of on-chip non-volatile memory device and broadcasts those parameters, using a predetermined protocol, to be used by various units on the integrated circuit chip. The broadcast module allows the entire non-volatile storage array (or the sub-section containing the process parameter information) to be read, and then allows the read data to be reformatted into a serial stream of binary digits, and finally allows the reformatted data to be transmitted via a single wire to any units on the chip that can be benefited from such information. The transmission can be "on demand" or initiated by one or more units, or can be continuously broadcasted by the broadcast module and used by the units as needed.

Figure 5:
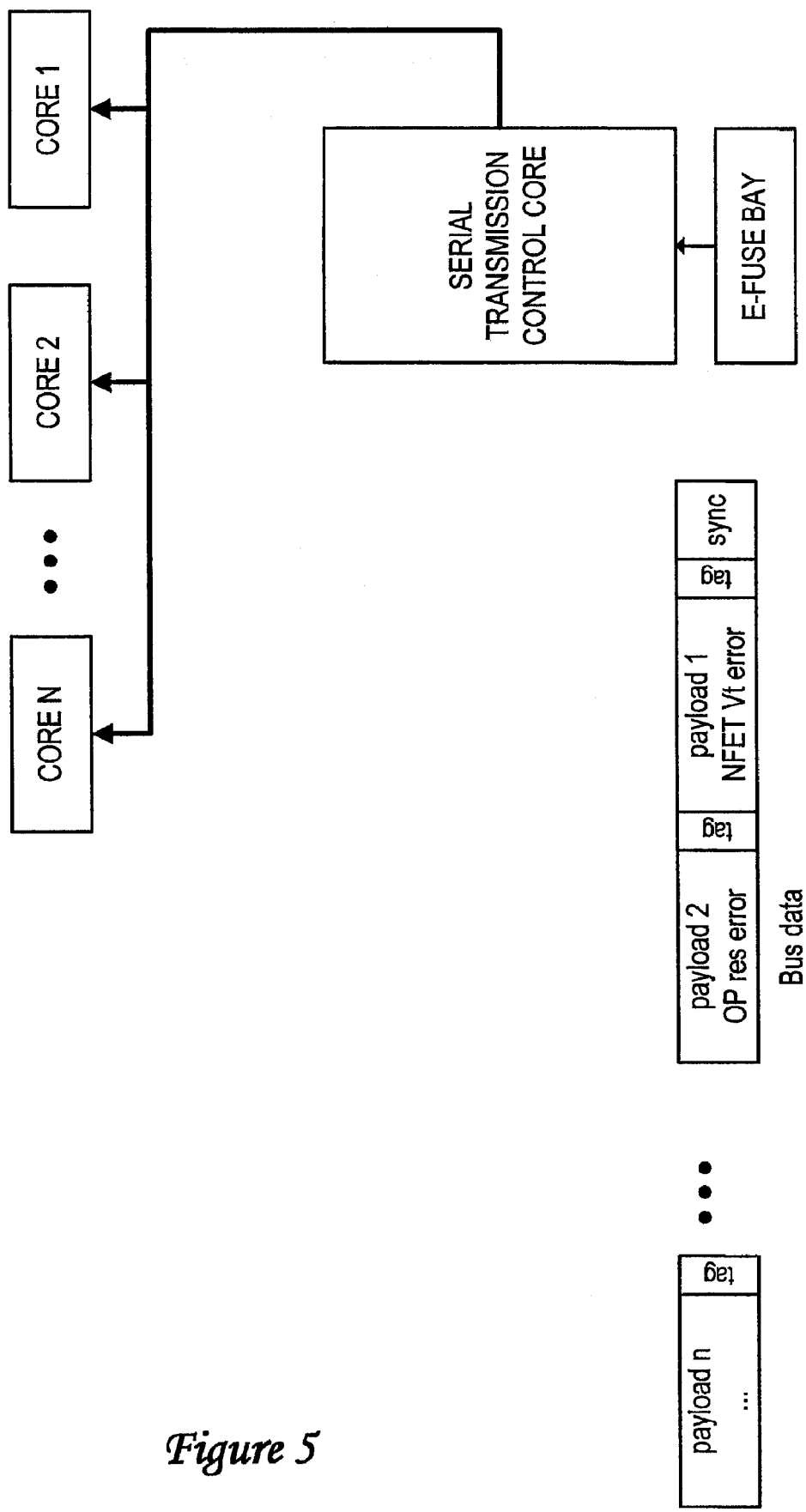
FIG. 5 is a block diagram of an apparatus for "broadcasting" information about specific device processing parameters to units on a chip, in accordance with a preferred embodiment of the present invention.

Referring now to FIG. 5, there is illustrated a block diagram of a protocol for sequencing the information packets onto a serial line using serial transmission techniques. Each specific packet of information is assigned a sequence number. For example, parameter #1 may represent the deviation from nominal in n-type transistor thresholds, parameter #2 may represent the error in a certain type of resistor, and so on as indicated. The binary digits representing these parameters are sequentially arranged in payload packets, each preceded by its sequence number also transmitted serially. At the beginning of each repetition of the broadcast, a synchronization character is sent so that units can correctly select those parameters that are useful to them.

As has been described, the present invention provides a method and apparatus for electrically altering the resistance of a resistor within an integrated circuit to match a predetermined value. Although an apparatus for altering resistance of a resistor is utilized to illustrate the present invention, it is understood by those skilled in the art that the efuse module of the present invention can also be utilized to store pertinent process related data including performance (speed/PSRO) measurements, raw process parameters such as $V_t$, $\Delta L$, $\Delta W$, $T_{ox}$, sheet resistance, capacitances, inductances, etc. A standardized bus or other method (such as a serial bus with compression) is used at the output of the efuse module. Each unit/core available for use in a chip that also has the efuse module may be designed to incorporate a standardized interface for receiving/decompressing all or part of the standardized output from the efuse module. After reception, each core or macro uses all or part of the information to tailor its function based on the process parameters it is most sensitive to.

While the invention has been particularly shown and described with reference to a preferred embodiment, it will be understood by those skilled in the art that various changes in form and detail may be made therein without departing from the spirit and scope of the invention.

What is claimed is:

1. A method for altering circuit characteristics to make them independent of processing parameters of a device within an integrated circuit, said method comprising:
   determining information of a process parameter of a wafer by measuring said process parameter at a selective number of chips;
   operating an on-chip unit as a broadcast module once the information concerning the deviation from a nominal in processing parameters is recorded in an e-fuse, wherein said on-chip unit reads information from a non-volatile storage array, reformats said read data into a stream of binary digits, and transmits said reformatted data to any other on-chip units; and
   storing said determined information of said process parameter in a storage device within one of said chips on said wafer, wherein said determined information of said process parameter are utilized to self-adjust certain operational characteristics of a functional component within said chip during operation, wherein said certain operational characteristics are associated with said process parameter.

2. The method of claim 1, wherein said method further includes estimating said process parameter of remaining chips on said wafer.

3. The method of claim 2, wherein said estimating is performed by a two-dimensional interpolation.

4. The method of claim 1, wherein said method further includes measuring kerf structures within said selective number of chips.

5. The method of claim 1, wherein said storing further includes storing electronic chip identification information.

6. The method of claim 1, wherein said storage device is an electrically programmable storage device.

7. An apparatus for altering resistances of on-chip resistors, said apparatus comprising:
   a first plurality of on-chip resistors on a chip and an off-chip resistor connected to said chip;
   a set of current sources for forcing substantially identical currents through said pair of on-chip resistors and said off-chip resistor;
   an on-chip unit operating as a broadcast module once the information concerning the deviation from a nominal in processing parameters is recorded in an e-fuse, wherein said on-chip unit reads information from a non-volatile storage array, reformats said read data into a stream of binary digits, and transmits said reformatted data to any other on-chip units;
   means for determining tolerances of said on-chip resistors by comparing voltage drops across said pair of on-chip resistors and said off-chip resistor; and
   a storage device within said chip for storing said determined tolerances to be utilized to self-adjust said pair of on-chip resistors within said chip during operation.

8. The apparatus of claim 7, wherein said apparatus further includes a multiplexor capable of directing said determined tolerances from said storage device to a termination circuit for adjusting the resistance of said first plurality of on-chip resistors during operation.

9. The apparatus of claim 8, wherein said termination circuit includes a plurality of resistors.

10. The apparatus of claim 7, wherein said apparatus further includes means for converting said determined tolerances to a set of digital values.

11. The apparatus of claim 7, wherein said storage device is an electrically programmable storage device.

12. The apparatus of claim 7, wherein said means for determining is a pair of comparators.

* * * * *